(12) United States Patent
McIlroy et al.

(10) Patent No.: US 11,180,648 B2
(45) Date of Patent: Nov. 23, 2021

(54) COMPOSITION COMPRISING A SEMI-CRYSTALLINE THERMOPLASTIC FLUOROPOLYMER AND A FLUORINATED THERMOPLASTIC ELASTOMER BLOCK COPOLYMER

(71) Applicant: SOLVAY SPECIALTY POLYMERS ITALY S.P.A., Bollate (IT)

(72) Inventors: David McIlroy, Johns Creek, GA (US); Keshav S. Gautam, Duluth, GA (US); Satchit Srinivasan, Dallas, TX (US)

(73) Assignee: SOLVAY SPECIALTY POLYMERS ITALY S.P.A., Bollate (IT)

( * ) Notice: Subject to any disclaimer, the term of this patent is extended or adjusted under 35 U.S.C. 154(b) by 261 days.

(21) Appl. No.: 16/494,761

(22) PCT Filed: Mar. 13, 2018

(86) PCT No.: PCT/EP2018/056291
§ 371 (c)(1),
(2) Date: Sep. 16, 2019

(87) PCT Pub. No.: WO2018/167090
PCT Pub. Date: Sep. 20, 2018

(65) Prior Publication Data
US 2020/0095413 A1 Mar. 26, 2020

Related U.S. Application Data

(60) Provisional application No. 62/471,127, filed on Mar. 14, 2017.

(51) Int. Cl.
*C08L 27/16* (2006.01)
*H05K 5/00* (2006.01)
*C08L 53/00* (2006.01)

(52) U.S. Cl.
CPC .............. *C08L 27/16* (2013.01); *C08L 53/00* (2013.01); *H05K 5/0017* (2013.01); *H05K 5/0086* (2013.01); *C08L 2201/02* (2013.01); *C08L 2203/20* (2013.01)

(58) Field of Classification Search
CPC ........... C08L 53/00; C08L 27/16; C08L 33/12
See application file for complete search history.

(56) References Cited

U.S. PATENT DOCUMENTS

| | | | |
|---|---|---|---|
| 6,207,758 B1 * | 3/2001 | Brinati | C08F 293/005 264/473 |
| 2020/0095415 A1 * | 3/2020 | McIlroy | C08L 53/00 |

FOREIGN PATENT DOCUMENTS

| | | |
|---|---|---|
| EP | 0924257 A1 | 6/1999 |
| WO | 1991002770 A1 | 3/1991 |
| WO | 1995027988 A2 | 10/1995 |
| WO | 1997047683 A1 | 12/1997 |
| WO | 2017021208 A1 | 2/2017 |

OTHER PUBLICATIONS

Standard ASTM D3418-08, "Standard Test Method for Transition Temperatures and Enthalpies of Fusion and Crystallization of Polymers by Differential Scanning Calorimetry", 2008, p. 1-7.

* cited by examiner

*Primary Examiner* — Mark S Kaucher
(74) *Attorney, Agent, or Firm* — Osha Bergman Watanabe & Burton LLP

(57) ABSTRACT

The invention pertains to a fluoropolymer composition based on a combination of a thermoplastic fluoropolymer and a fluorinated thermoplastic elastomer, possessing improved impact resistance and outstanding flammability behaviour, to a method of making the same, and to a method of manufacturing shaped parts using the same, and to a method of manufacturing a mobile electronic device using said parts.

20 Claims, No Drawings

COMPOSITION COMPRISING A SEMI-CRYSTALLINE THERMOPLASTIC FLUOROPOLYMER AND A FLUORINATED THERMOPLASTIC ELASTOMER BLOCK COPOLYMER

This application is a U.S. national stage entry under 35 U.S.C. § 371 of International Application No. PCT/EP2018/056291 filed Mar. 13, 2018, which claims priority to U.S. provisional application No. 62/471,127, filed on Mar. 14, 2017. The entire contents of these applications are explicitly incorporated herein by this reference.

TECHNICAL FIELD

The invention pertains to a fluoropolymer composition possessing improved impact resistance and outstanding flammability behaviour, to a method of making the same, and to a method of manufacturing shaped parts using the same, and to a method of manufacturing a mobile electronic device using said parts.

BACKGROUND ART

Nowadays, mobile electronic devices such as mobile phones, personal digital assistants (PDAs), laptop computers, MP3 players, and so on, are in widespread use around the world. Mobile electronic devices are getting smaller and lighter for even more portability and convenience, while at the same time becoming increasingly capable of performing more advanced functions and services, both due to the development of the devices and the network systems.

While for convenience sake, it is often desirable that these devices be small and lightweight, they still need to possess a certain structural strength so that they will not be damaged in normal handling and occasional drops. Thus, usually built into such devices are structural parts whose primary function is to provide strength and/or rigidity and/or impact resistance to the device, and possibly also provide mounting places for various internal components of the device and/or part or all of the mobile electronic device case (outer housing), while ensuring electrical insulation/electrical shield among components and possessing suitable anti-flame performances to comply with strict applicable standards and regulatory requirements. Plastic parts of such devices are hence made from materials that are easy to process into various and complex shapes, are able to withstand the rigors of frequent use, including outstanding impact resistance, generally possess electrical insulating capabilities, and which can meet challenging flammability performances without interfering with the afore-mentioned performances' profile.

An additional requirement for plastics material used in mobile electronics part is that they shall be resistant to staining agents that are often put in contact with these portable electronic devices housings. Typical staining agents include: makeup (such as lipstick, lip gloss, lip liner, lip plumper, lip balm, foundation, powder, blush), artificial or natural colorants (such as those found in soft drinks, coffee, red wine, mustard, ketchup and tomato sauce), dyes and pigments (such as those found in dyed textiles and leather, used for the manufacture of portable electronic devices housings). In contact with these staining agents, the portable electronic devices housings maybe easily stained: anti-stain properties are hence much appreciated for maintaining aesthetic appearance of said portable devices, in particular when the same are bright coloured or in shades of white or clear colours.

Providing a polymeric composition fulfilling all afore-mentioned requirements, that is to say possessing adequate mechanical performances for ensuring structural support (tensile strength) and yet a certain flexibility for enabling mounting/assembling (elongation at break), able to withstand to impact and to aggressive chemicals, having colorability and stain resistance, and yet ensuring compliance with strict flammability resistance requirements, as imposed, from time to time, in connection with powered systems, is a continuous challenge in this field, and while solutions based on a variety of plastics have already been attempted, still continuous improvements to reach unmet challenges are required.

Within this frame, WO 2017/021208 (SOLVAY SPECIALTY POLYMERS IT) Sep. 2, 2017 discloses mobile electronic devices comprising at least one part made of a fluoropolymer composition comprising at least one at least one vinylidene fluoride polymer and at least one acrylic elastomer, possessing significantly improved impact resistance, while still maintaining other advantageous properties of VDF polymers, including colorability, surface finish in injection molded parts, acceptable stain resistance and satisfactory mechanical performances.

SUMMARY OF INVENTION

Within this frame, the present invention aims at providing a solution based on the use of a particular composition based on fluorinated polymers.

More specifically, the invention is directed, in a first aspect, to a fluoropolymer composition [composition (C)], said composition comprising:
  at least one thermoplastic fluoropolymer [polymer (F)], said polymer (F) possessing a heat of fusion ($\Delta H_f$) of the polymer (F-TPE) of at least 25 J/g, when determined according to ASTM D3418, said polymer (F) being present in in an amount of from 50 to 95% wt;
  at least one thermoplastic elastomer [polymer (F-TPE)] comprising:
    (i) at least one elastomeric block (A) consisting of a sequence of recurring units, said sequence comprising recurring units derived from at least one fluorinated monomer, said block (A) possessing a glass transition temperature of less than 25° C., as determined according to ASTM D3418,
    (ii) at least one thermoplastic block (B) consisting of a sequence of recurring units, said sequence comprising recurring units derived from at least one fluorinated monomer,
    wherein the crystallinity of said block (B) and its weight fraction in the polymer (F-TPE) are such to provide for a heat of fusion ($\Delta H_f$) of the polymer (F-TPE) of at most 20 J/g, when determined according to ASTM D3418,
    said polymer (F-TPE) being present in an amount of from 5 to 35% wt; and optionally
  at least one methyl methacrylate polymer [polymer (M)] in an amount of at most 25% wt,
  the % wt being referred to the sum of weights of polymer (F), polymer (F-TPE) and polymer (M).

A further object of the present invention is a method for manufacturing a part of a mobile electronic device, said method comprising moulding said composition (C) so as to provide said part.

Still another object of the invention is the manufacture of a mobile electronic device, said method including the steps of:

a. providing as components at least a circuit board, a screen and a battery;

b. providing at least one part made of the polymer composition (C), as above detailed; and c. assembling at least one of said components with said part or mounting at least one of said components on said part.

The Applicant has surprisingly found that compositions (C), as above detailed, thanks to the incorporation of aforementioned amounts of polymer (F-TPE) in the stiff vinylidene fluoride polymer matrix are delivering a particularly advantageous combinations of properties which make them particularly adapted for the manufacture of parts of mobile electronic devices. More specifically, composition (C) possesses good mechanical properties, and simultaneously has outstanding impact resistance, and excellent stain resistance, while still maintaining excellent flammability.

DESCRIPTION OF EMBODIMENTS

The Polymer (F)

The expression "thermoplastic fluoropolymer" and "polymer (F)" are used, within the frame of the present invention for designating polymers comprising recurring units derived from fluorinated monomer(s). In particular, polymer (F) is generally selected among polyaddition polymers comprising recurring units derived from ethylenically unsaturated monomers comprising fluorine atom(s), which are generally selected from the group consisting of:

(a) $C_2$-$C_8$ perfluoroolefins such as tetrafluoroethylene (TFE), hexafluoropropylene (HFP), perfluoroisobutylene;

(b) hydrogen-containing $C_2$-$C_8$ fluoroolefins, such as vinylidene fluoride (VDF), vinyl fluoride (VF), trifluoroethylene (TrFE), hexafluoroisobutylene (HFIB), perfluoroalkyl ethylenes of formula $CH_2=CH-R_{f1}$, wherein $R_{f1}$ is a $C_1$-$C_6$ perfluoroalkyl group;

(c) $C_2$-$C_8$ chloro- and/or bromo-containing fluoroolefins such as chlorotrifluoroethylene (CTFE);

(d) perfluoroalkylvinylethers (PAVE) of formula $CF_2=CFOR_{f1}$, wherein $R_{f1}$ is a $C_1$-$C_6$ perfluoroalkyl group, such as $CF_3$ (PMVE), $C_2F_5$ or $C_3F_7$;

(e) perfluorooxyalkylvinylethers of formula $CF_2=CFOX_0$, wherein $X_0$ is a a $C_1$-$C_{12}$ perfluorooxyalkyl group comprising one or more than one ethereal oxygen atom, including notably perfluoromethoxyalkylvinylethers of formula $CF_2=CFOCF_2OR_{f2}$, with $R_{f2}$ being a $C_1$-$C_3$ perfluoro(oxy)alkyl group, such as $-CF_2CF_3$, $-CF_2CF_2-O-CF_3$ and $-CF_3$; and (f) (per)fluorodioxoles of formula:

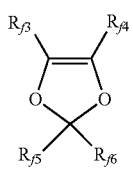

wherein each of $R_{f3}$, $R_{f4}$, $R_{f5}$ and $R_{f6}$, equal to or different from each other, is independently a fluorine atom, a $C_1$-$C_6$ perfluoro(oxy)alkyl group, optionally comprising one or more oxygen atoms, such as $-CF_3$, $-C_2F_5$, $-C_3F_7$, $-OCF_3$ or $-OCF_2CF_2OCF_3$.

Preferably, the polymer (F) of the invention is a partially fluorinated fluoropolymer, because of their easier processability and costs advantages.

To the purpose of the present invention, the term "partially fluorinated fluoropolymer" is intended to denote any fluoropolymer comprising:

recurring units derived from at least one fluorinated monomer; and recurring units derived from at least one ethylenically unsaturated monomer comprising at least one hydrogen atom (hereinafter, hydrogen-containing monomer).

The fluorinated monomer and the hydrogen-containing monomer may be the same monomer or may be different monomers.

The partially fluorinated fluoropolymer comprises advantageously more than 1% mol, preferably more than 5% mol, more preferably more than 10% mol of recurring units derived from the hydrogen-containing monomer, with respect to the overall number of recurring units of the same.

The partially fluorinated fluoropolymer comprises advantageously more than 25% mol, preferably more than 30% mol, more preferably more than 40% mol of recurring units derived from the fluorinated monomer, with respect to the overall number of recurring units of the same.

Should the fluorinated monomer be a hydrogen-containing fluorinated monomer, such as for instance vinylidene fluoride, trifluoroethylene, vinylfluoride, the partially fluorinated fluoropolymer can be either a homopolymer comprising recurring units derived from said hydrogen-containing fluorinated monomer, or a copolymer comprising recurring units derived from said hydrogen-containing fluorinated monomer and from at least one other monomer, which can be either free of fluorine atom or fluorinated.

More preferably, polymer (F) is selected from:

(A-1) copolymers comprising (a1-1) recurring units derived from at least one per(halo)fluoromonomer(s) selected from tetrafluoroethylene and chlorotrifluoroethylene and (a1-2) recurring units derived from at least one fluorine-free hydrogenated monomer selected from the group consisting of ethylene, propylene and isobutylene (preferably ethylene), generally with a molar ratio per(halo)fluoromonomer(s)/hydrogenated comonomer(s) of from 30:70 to 70:30, optionally containing one or more comonomers in amounts of from 0.1 to 30% by moles, based on the total amount of per(halo)fluoromonomer(s)/hydrogenated comonomer(s);

(A-2) Vinylidene fluoride (VDF) polymers.

Polymer (F) is preferably a vinylidene fluoride polymer.

The expression vinylidene fluoride polymer is used within the frame of the present invention for designating polymers essentially made of recurring units, more that 50% by moles of said recurring units being derived from vinylidene fluoride (VDF).

The vinylidene fluoride polymer [polymer (VDF)] is preferably a polymer comprising:

(a') at least 60% by moles, preferably at least 75% by moles, more preferably 85% by moles of recurring units derived from vinylidene fluoride (VDF);

(b') optionally from 0.1 to 15%, preferably from 0.1 to 12%, more preferably from 0.1 to 10% by moles of recurring units derived from a fluorinated monomer different from VDF; and (c') optionally from 0.1 to 5%, by moles, preferably 0.1 to 3% by moles, more preferably 0.1 to 1% by moles of recurring units derived from one or more hydrogenated comonomer(s), all the aforementioned % by moles being referred to the total moles of recurring units of the polymer (VDF).

The said fluorinated monomer is advantageously selected in the group consisting of vinyl fluoride ($VF_1$); trifluoroethylene (VF₃); chlorotrifluoroethylene (CTFE); 1,2-difluoroethylene; tetrafluoroethylene (TFE); hexafluoropropylene (HFP); perfluoro(alkyl)vinyl ethers, such as perfluoro(methyl)vinyl ether (PMVE), perfluoro(ethyl) vinyl ether (PEVE) and perfluoro(propyl)vinyl ether (PPVE); perfluoro(1,3-dioxole); perfluoro(2,2-dimethyl-1,3-dioxole) (PDD). Preferably, the possible additional fluorinated monomer is chosen from chlorotrifluoroethylene (CTFE), hexafluoroproylene (HFP), trifluoroethylene (VF3) and tetrafluoroethylene (TFE).

The choice of the said hydrogenated comonomer(s) is not particularly limited; alpha-olefins, (meth)acrylic monomers, vinyl ether monomers, styrenic mononomers may be used; nevertheless, to the sake of optimizing chemical resistance, embodiment's wherein the polymer (F) is essentially free from recurring units derived from said hydrogenated comonomer(s) are preferred.

Accordingly, the vinylidene fluoride polymer [polymer (VDF)] is more preferably a polymer consisting essentially of:

(a') at least 60% by moles, preferably at least 75% by moles, more preferably 85% by moles of recurring units derived from vinylidene fluoride (VDF);

(b') optionally from 0.1 to 15%, preferably from 0.1 to 12%, more preferably from 0.1 to 10% by moles of a fluorinated monomer different from VDF; said fluorinated monomer being preferably selected in the group consisting of vinylfluoride (VF₁), chlorotrifluoroethylene (CTFE), hexafluoropropene (HFP), tetrafluoroethylene (TFE), perfluoromethylvinylether (MVE), trifluoroethylene (TrFE) and mixtures therefrom, all the aforementioned % by moles being referred to the total moles of recurring units of the polymer (VDF).

Defects, end chains, impurities, chains inversions or branchings and the like may be additionally present in the polymer (VDF) in addition to the said recurring units, without these components substantially modifying the behaviour and properties of the polymer (F).

As non-limitative examples of polymers (VDF) useful in the present invention, mention can be notably made of homopolymers of VDF, VDF/TFE copolymers, VDF/TFE/HFP copolymers, VDF/TFE/CTFE copolymers, VDF/TFE/TrFE copolymers, VDF/CTFE copolymers, VDF/HFP copolymers, VDF/TFE/HFP/CTFE copolymers and the like.

VDF homopolymers are particularly advantageous for being used as polymer (F) in the composition (C).

The melt index of the polymer (VDF) is advantageously at least 0.01, preferably at least 0.05, more preferably at least 0.1 g/10 min and advantageously less than 50, preferably less than 30, more preferably less than 20 g/10 min, when measured in accordance with ASTM test No. 1238, run at 230° C., under a piston load of 2.16 kg.

The melt index of the polymer (VDF) is advantageously at least 1, preferably at least 2, more preferably at least 5 g/10 min and advantageously less than 70, preferably less than 50, more preferably less than 40 g/10 min, when measured in accordance with ASTM test No. 1238, run at 230° C., under a piston load of 5 kg.

A melt index in above recited range is particularly effective for ensuring good processability of composition (C).

The polymer (VDF) has advantageously a melting point ($T_{m2}$) advantageously of at least 120° C., preferably at least 125° C., more preferably at least 130° C. and of at most 190° C., preferably at most 185° C., more preferably at most 180° C., when determined by DSC, at a heating rate of 10° C./min, according to ASTM D 3418.

The Fluorinated Thermoplastic Elastomer [Polymer (F-TPE)]

For the purpose of the present invention, the term "elastomeric", when used in connection with the "block (A)" is hereby intended to denote a polymer chain segment which, when taken alone, is substantially amorphous, that is to say, has a heat of fusion of less than 2.0 J/g, preferably of less than 1.5 J/g, more preferably of less than 1.0 J/g, as measured according to ASTM D3418.

For the purpose of the present invention, the term "thermoplastic", when used in connection with the "block (B)", is hereby intended to denote a polymer chain segment which, when taken alone, is semi-crystalline, and possesses a detectable melting point, with an associated heat of fusion of exceeding 10.0 J/g, as measured according to ASTM D3418.

The fluorinated thermoplastic elastomer of the composition (C) of the invention is advantageously a block copolymer, said block copolymer typically having a structure comprising at least one block (A) alternated to at least one block (B), that is to say that said fluorinated thermoplastic elastomer typically comprises, preferably consists of, one or more repeating structures of type (B)-(A)-(B). Generally, the polymer (F-TPE) has a structure of type (B)-(A)-(B), i.e. comprising a central block (A) having two ends, connected at both ends to a side block (B).

The block (A) is often alternatively referred to as soft block (A); the block (B) is often alternatively referred to as hard block (B).

The term "fluorinated monomer" is hereby intended to denote an ethylenically unsaturated monomer comprising at least one fluorine atom.

The fluorinated monomer may further comprise one or more other halogen atoms (Cl, Br, I).

Any of block(s) (A) and (B) may further comprise recurring units derived from at least one hydrogenated monomer, wherein the term "hydrogenated monomer" is intended to denote an ethylenically unsaturated monomer comprising at least one hydrogen atom and free from fluorine atoms.

The elastomeric block (A) may further comprise recurring units derived from at least one bis-olefin [bis-olefin (OF)] of formula:

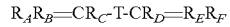

$$R_A R_B = CR_C - T - CR_D = R_E R_F$$

wherein $R_A$, $R_B$, $R_C$, $R_D$, $R_E$ and $R_F$, equal to or different from each other, are selected from the group consisting of H, F, Cl, $C_1$-$C_5$ alkyl groups and $C_1$-$C_5$ (per)fluoroalkyl groups, and T is a linear or branched $C_1$-$C_{18}$ alkylene or cycloalkylene group, optionally comprising one or more than one ethereal oxygen atom, preferably at least partially fluorinated, or a (per)fluoropolyoxyalkylene group.

The bis-olefin (OF) is preferably selected from the group consisting of those of any of formulae (OF-1), (OF-2) and (OF-3):

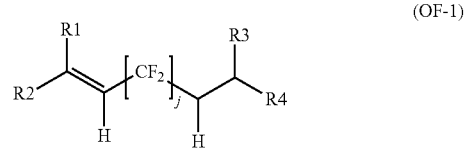

(OF-1)

wherein j is an integer comprised between 2 and 10, preferably between 4 and 8, and R1, R2, R3 and R4, equal to or different from each other, are selected from the group consisting of H, F, $C_1$-$C_5$ alkyl groups and $C_1$-$C_5$ (per)fluoroalkyl groups;

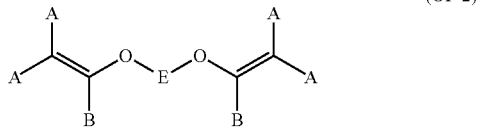

(OF-2)

wherein each of A, equal to or different from each other and at each occurrence, is independently selected from the group consisting of H, F and Cl; each of B, equal to or different from each other and at each occurrence, is independently selected from the group consisting of H, F, Cl and $OR_B$, wherein $R_B$ is a branched or straight chain alkyl group which may be partially, substantially or completely fluorinated or chlorinated, E is a divalent group having 2 to 10 carbon atoms, optionally fluorinated, which may be inserted with ether linkages; preferably E is a —$(CF_2)_m$— group, wherein m is an integer comprised between 3 and 5; a preferred bis-olefin of (OF-2) type is $F_2C$=$CF$—$O$—$(CF_2)_5$—$O$—$CF$=$CF_2$;

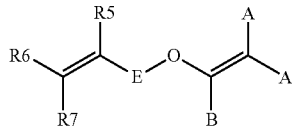

wherein E, A and B have the same meaning as defined above, R5, R6 and R7, equal to or different from each other, are selected from the group consisting of H, F, $C_1$-$C_5$ alkyl groups and $C_1$-$C_5$ (per)fluoroalkyl groups.

Should the block (A) consist of a recurring units sequence further comprising recurring units derived from at least one bis-olefin (OF), said sequence typically comprises recurring units derived from the said at least one bis-olefin (OF) in an amount comprised between 0.01% and 1.0% by moles, preferably between 0.03% and 0.5% by moles, more preferably between 0.05% and 0.2% by moles, based on the total moles of recurring units of block (A).

The polymer (F-TPE) typically comprises, preferably consists of:
at least one elastomeric block (A) selected from the group consisting of:
(1) vinylidene fluoride (VDF)-based elastomeric blocks ($A_{VDF}$) consisting of a sequence of recurring units, said sequence comprising recurring units derived from VDF and recurring units derived from at least one fluorinated monomer different from VDF, said fluorinated monomer different from VDF being typically selected from the group consisting of:
(a) $C_2$-$C_8$ perfluoroolefins such as tetrafluoroethylene (TFE), hexafluoropropylene (HFP);
(b) hydrogen-containing $C_2$-$C_8$ fluoroolefins different from VDF, such as vinyl fluoride, trifluoroethylene (TrFE), hexafluoroisobutylene (HFIB), perfluoroalkyl ethylenes of formula $CH_2$=$CH$—$R_{f1}$, wherein $R_{f1}$ is a $C_1$-$C_6$ perfluoroalkyl group;
(c) $C_2$-$C_8$ chloro- and/or bromo-containing fluoroolefins such as chlorotrifluoroethylene (CTFE);

(d) perfluoroalkylvinylethers (PAVE) of formula $CF_2$=$CFOR_{f1}$, wherein $R_{f1}$ is a $C_1$-$C_6$ perfluoroalkyl group, such as $CF_3$ (PMVE), $C_2F_5$ or $C_3F_7$;
(e) perfluorooxyalkylvinylethers of formula $CF_2$=$CFOX_0$, wherein $X_0$ is a a $C_1$-$C_{12}$ perfluorooxyalkyl group comprising one or more than one ethereal oxygen atom, including notably perfluoromethoxyalkylvinylethers of formula $CF_2$=$CFOCF_2OR_{f2}$, with $R_{f2}$ being a $C_1$-$C_3$ perfluoro(oxy)alkyl group, such as —$CF_2CF_3$, —$CF_2CF_2$—$O$—$CF_3$ and —$CF_3$; and
(f) (per)fluorodioxoles of formula:

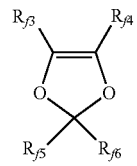

wherein each of $R_{f3}$, $R_{f4}$, $R_{f5}$ and $R_{f6}$, equal to or different from each other, is independently a fluorine atom, a $C_1$-$C_6$ perfluoro(oxy)alkyl group, optionally comprising one or more oxygen atoms, such as —$CF_3$, —$C_2F_5$, —$C_3F_7$, —$OCF_3$ or —$OCF_2CF_2OCF_3$; and
(2) tetrafluoroethylene (TFE)-based elastomeric blocks ($A_{TFE}$) consisting of a sequence of recurring units, said sequence comprising recurring units derived from TFE and recurring units derived from at least one fluorinated monomer different from TFE, said fluorinated monomer being typically selected from the group consisting of those of classes (b), (c), (d), (e) as defined above;
at least one thermoplastic block (B) consisting of a sequence of recurring, said sequence comprising recurring units derived from at least one fluorinated monomer.

Any of block(s) ($A_{VDF}$) and ($A_{TFE}$) may further comprise recurring units derived from at least one hydrogenated monomer, which may be selected from the group consisting of $C_2$-$C_8$ non-fluorinated olefins such as ethylene, propylene or isobutylene, and may further comprise recurring units derived from at least one bis-olefin (OF), as above detailed.

The elastomeric block (A) is preferably a block ($A_{VDF}$), as above detailed, said block ($A_{VDF}$) typically consisting of a sequence of recurring units comprising, preferably consisting of:
from 45% to 80% by moles of recurring units derived from vinylidene fluoride (VDF),
from 5% to 50% by moles of recurring units derived from at least one fluorinated monomer different from VDF,
optionally, up to 1.0% by moles of recurring units derived from at least one bis-olefin (OF), as above detailed; and
optionally, up to 30% by moles of recurring units derived from at least one hydrogenated monomer,
with respect to the total moles of recurring units of the sequence of block ($A_{VDF}$).

Block (B) may consist of a sequence of recurring units, said sequence comprising:
recurring units derived from one or more than one fluoromonomer, preferably selected from the group consisting of:
(a) $C_2$-$C_8$ perfluoroolefins such as tetrafluoroethylene (TFE), hexafluoropropylene (HFP);
(b) hydrogen-containing $C_2$-$C_8$ fluoroolefins, such as vinylidene fluoride (VDF), vinyl fluoride, trifluoroethylene (TrFE), hexafluoroisobutylene (HFIB), perfluoroalkyl ethylenes of formula $CH_2=CH-R_{f1}$, wherein $R_{f1}$ is a $C_1$-$C_6$ perfluoroalkyl group;

(c) $C_2$-$C_8$ chloro- and/or bromo-containing fluoroolefins such as chlorotrifluoroethylene (CTFE);

(d) perfluoroalkylvinylethers (PAVE) of formula $CF_2=CFOR_{f1}$, wherein $R_{f1}$ is a $C_1$-$C_6$ perfluoroalkyl group, such as $CF_3$ (PMVE), $C_2F_5$ or $C_3F_7$;

(e) perfluorooxyalkylvinylethers of formula $CF_2=CFOX_0$, wherein $X_0$ is a a $C_1$-$C_{12}$ perfluorooxyalkyl group comprising one or more than one ethereal oxygen atom, including notably perfluoromethoxyalkylvinylethers of formula $CF_2=CFOCF_2OR_{f2}$, with $R_{f2}$ being a $C_1$-$C_3$ perfluoro(oxy)alkyl group, such as $-CF_2CF_3$, $-CF_2CF_2-O-CF_3$ and $-CF_3$; and (f) (per)fluorodioxoles of formula:

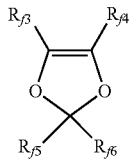

wherein each of $R_{f3}$, $R_{f4}$, $R_{f5}$ and $R_{f6}$, equal to or different from each other, is independently a fluorine atom, a $C_1$-$C_6$ perfluoro(oxy)alkyl group, optionally comprising one or more oxygen atoms, such as $-CF_3$, $-C_2F_5$, $-C_3F_7$, $-OCF_3$ or $-OCF_2CF_2OCF_3$; and optionally, recurring units derived from one or more than one hydrogenated monomer, as above detailed, including notably ethylene, propylene, (meth)acrylic monomers, styrenic monomers.

More specifically, block (B) may be selected from the group consisting of:

blocks ($B_{VDF}$) consisting of a sequence of recurring units derived from vinylidene fluoride and optionally from one or more than one additional fluorinated monomer different from VDF, e.g. HFP, TFE or CTFE, and optionally from a hydrogenated monomer, as above detailed, e.g. a (meth)acrylic monomer, whereas the amount of recurring units derived from VDF is of 85 to 100% moles, based on the total moles of recurring units of block ($B_{VDF}$);

blocks ($B_{TFE}$) consisting of a sequence of recurring units derived from tetrafluoroethylene, and optionally from an additional perfluorinated monomer different from TFE, whereas the amount of recurring units derived from TFE is of 75 to 100% moles, based on the total moles of recurring units of block (B);

blocks ($B_{E/(C)TFE}$) consisting of a sequence of recurring units derived from ethylene and recurring units derived from CTFE and/or TFE, possibly in combination with an additional monomer.

The weight ratio between blocks (A) and blocks (B) in the fluorinated thermoplastic elastomer is typically comprised between 95:5 and 10:90.

According to certain preferred embodiments, the polymers (F-TPE) comprise a major amount of blocks (A); according to these embodiment's, the polymer (F-TPE) used in the method of the present invention is characterized by a weight ratio between blocks (A) and blocks (B) of 95:5 to 65:35, preferably 90:10 to 70:30.

The crystallinity of block (B) and its weight fraction in the polymer (F-TPE) are such to provide for a heat of fusion ($\Delta H_f$) of the polymer (F-TPE) of at most 20 J/g, preferably at most 18 J/g, more preferably at most 15 J/g, when determined according to ASTM D3418; on the other side, polymer (F-TPE) combines thermoplastic and elastomeric character, so as to possess a certain crystallinity, delivering a heat of fusion of at least 2.5 J/g, preferably at least 3.0 J/g.

Preferred polymers (F-TPE) are those comprising:
at least one elastomeric block ($A_{VDF}$), as above detailed, and
at least one thermoplastic block ($B_{VDF}$), as above detailed, and
wherein the crystallinity of said block (B) and its weight fraction in the polymer (F-TPE) are such to provide for a heat of fusion of the polymer (F-TPE) of at most 15 J/g, when determined according to ASTM D3418.

The Polymer (M)

With regard to the expressions "methyl methacrylate polymer" or "polymer (M)", these terms are hereby used to denote methyl methacrylate homopolymers and methyl methacrylate copolymers which have a preponderant content of methyl methacrylate and a minor content of other monomers selected from alkyl(meth)acrylates, acrylonitrile, butadiene, styrene and isoprene.

Advantageous results are obtained with homopolymers of methyl methacrylate and copolymers of methyl methacrylate and of $C_2$-$C_6$ alkyl acrylates. Outstanding results are obtained with homopolymers of methyl methacrylate and copolymers of methyl methacrylate and of $C_2$-$C_4$ alkyl acrylates such as, for example, butyl acrylate. The methyl methacrylate content of the copolymers is generally at least approximately 55% by weight and preferably at least approximately 60% by weight. It generally does not exceed approximately 90% by weight; in most cases it does not exceed 80% by weight, with respect to the total weight of polymer (M).

Advantageously, the polymer (M) may contain 0 to 20 percent and preferably 5 to 15 percent of at least one of methyl acrylate, ethyl acrylate and butyl acrylate, by weight of polymer (M).

The polymer (M) may be functionalised, that is to say it contains, for example, acid, acid chloride, alcohol or anhydride functional groups. These functional groups may be introduced by grafting or by copolymerisation. Advantageously, this is an acid functional group provided by the acrylic acid comonomer. Two neighbouring acrylic acid functional groups may lose water to form an anhydride. The proportion of functional groups may be between 0 and 15 percent by weight of the polymer (M) containing the optional functional groups.

The polymer (M) has advantageously a glass transition temperature of at least 80° C., preferably of at least 85° C., more preferably of at least 100° C., when measured according to according to ASTM D 3418.

According to certain preferred embodiments, the polymer (M) is polymethylmethacrylate homopolymer.

The Composition (C)

The amount of polymer (F-TPE) in the composition (C) is generally of at least 7% wt; and/or is advantageously of at most 33% wt with respect to the total weight of polymer (F), polymer (F-TPE) and polymer (M).

The amount of polymer (F) in the composition (C) is of at least 55% wt and/or is of at most 95% wt, with respect to the total weight of polymer (F), polymer (F-TPE) and polymer (M).

While, as explained, the presence of polymer (M) in the composition (C) is not mandatory, that is to say its amount may be zero, upper boundaries for the amount of polymer (M) are generally as hereafter defined: the amount of polymer (M) in the composition (C) is generally of at most 25% wt, preferably at most 20% wt, more preferably at most 15% wt, with respect to the total weight of polymer (F), polymer (F-TPE) and polymer (M).

According to certain embodiment's, the composition (C) does not comprise any polymer (M) as above detailed. According to these embodiment's, the preferred composition (C) comprises:

from 65 to 95% wt, preferably from 67 to 93% wt, more preferably from 70 to 90% wt of polymer (F-TPE) and
from 5 to 35% wt, preferably from 7 to 33% wt, more preferably from 10 to 30% wt of polymer (F),
wherein % wt is defined with respect to the total weight of polymer (F-TPE) and polymer (F).

According to certain other embodiment's, polymer (M) is present in the composition. According to these embodiment's, the preferred composition (C) comprises:

from 55 to 90% wt, preferably from 60 to 85% wt of polymer (F-TPE);
from 7 to 30% wt, preferably from 10 to 27% wt of polymer (F); and
from 3 to 20% wt, preferably from 5 to 18% wt of polymer (M),
with respect to the total weight of polymer (F), polymer (F-TPE) and polymer (M).

The composition (C) may further comprise, in addition to polymer (F), polymer (F-TPE), and possibly polymer (M), one or more additives, notably one or more additives selected from the group consisting of pigments, processing aids, plasticizers, stabilizers, mold release agents, and the like.

When present, additives are generally comprised in the composition (C) in amounts not exceeding 10 parts, preferably not exceeding 5 parts per 100 weight parts of polymer (F), polymer (F-TPE) and polymer (M).

Preferred embodiments are those wherein the composition (C) consists of polymer (F), polymer (F-TPE), polymer (M) and optionally from 0 to 10 weight parts, per 100 weight parts of polymer (F), polymer (F-TPE) and polymer (M), of one or more than one additive.

To the sake of aesthetic appearance is generally understood that the composition will comprise at least one additive selected from pigments.

Pigments useful in composition (C) are generally selected among oxides, sulfides, oxides hydroxides, silicates, sulfates, titanates, phosphates, carbonates and mixtures thereof.

White inorganic pigments are preferred in the composition (C) when aiming at providing white parts.

Among white pigments suitable for the composition of the invention mention can be made of $TiO_2$ pigments (e.g. rutile, anatase), Zinc oxide (ZnO) pigments (e.g. Zinc white, Chinese white or flowers of Zinc), Zinc sulphide (ZnS) pigments, lithopone (mixed pigment produced from Zinc sulphide and barium sulphate) pigments, white lead pigments (basic lead carbonate), Barium sulphate, and corresponding complex pigments obtained from coating of above mentioned pigments on suitable inorganic carriers, e.g. silicates, alumino-silicates, mica and the like.

Particularly preferred pigments are Zinc oxide and Zinc sulphide pigments, which have been shown to produce, when incorporated in the composition (C) moulded parts possessing outstanding whiteness.

As said above, it may be appropriate, in certain cases, to add minor amounts of coloured pigments in combination with any of the white pigment mentioned above, so as to tune colour coordinate towards a target white colour, and/or for reducing yellowness or for any other reason.

Coloured pigments useful in the composition (C) notably include, or will comprise, one or more of the following: Artic blue #3, Topaz blue #9, Olympic blue #190, Kingfisher blue #211, Ensign blue #214, Russet brown #24, Walnut brown #10, Golden brown #19, Chocolate brown #20, Ironstone brown #39, Honey yellow #29, Sherwood green #5, and Jet black #1 available from Shepard Color Company, Cincinnati, Ohio, USA.; black F-2302, blue V-5200, turquoise F-5686, green F-5687, brown F-6109, buff F-6115, chestnut brown V-9186, and yellow V-9404 available from Ferro Corp., Cleveland, Ohio, USA and METEOR® pigments available from Englehard Industries, Edison, N.J., USA; ultramarine blue #54, ultramarine violet #5012, commercially available from Hollidays Pigments International.

Within this context, hence, preferred embodiments are those wherein the composition (C) consists of polymer (F), polymer (F-TPE), polymer (M) and from 0.01 to 10 weight parts, per 100 weight parts of polymer (F), polymer (F-TPE), polymer (M), of one or more than one additive, at least one of said additives being a pigment, as above detailed, said at least one pigment being used in an amount of from 0.01 to 5, preferably of from 0.01 to 3 weight parts, per 100 weight parts of polymer (F), polymer (F-TPE), and polymer (M).

The Method of Making the Composition (C)

The invention further pertains to a method of making the composition (C), as above detailed.

The method advantageously generally includes at least one step of mixing polymer (F), polymer (F-TPE), and possibly polymer (M). Mixing can be effected using standard mixing devices; generally polymer (F), polymer (F-TPE) and polymer (M) (when present) are mixed in the molten form; nevertheless, methods wherein polymer (F), polymer (F-TPE) and polymer (M) (when present) are mixed under the form of latexes and then co-coagulated and/or methods wherein polymer (F), polymer (F-TPE) and polymer (M) (when present) are mixed as solutions in appropriate solvent or as powders can also be practiced.

Mixing in the molten state is generally accomplished using extruder devices, with twin-screw extruders being preferred.

It is hence common practice of manufacturing the composition (C) under the form of pellets.

The Mobile Electronic Device

The invention further pertains to a mobile electronic device comprising at least one part made of a fluoropolymer composition [composition (C)], as above detailed.

The term "mobile electronic device" is intended to denote any electronic devices that are designed to be conveniently transported and used in various locations while exchanging/providing access to data, e.g. through wireless connections or mobile network connection. Representative examples of mobile electronic devices include mobile phones, personal digital assistants, laptop computers, tablet computers, radios, cameras and camera accessories, watches, calculators, music players, global positioning system receivers, portable games, hard drives and other electronic storage devices, and the like.

The at least one part of the mobile electronic device according to the present invention may be selected from a large list of articles such as fitting parts, snap fit parts, mutually movable parts, functional elements, operating elements, tracking elements, adjustment elements, carrier elements, frame elements, switches, connectors and (internal and external) components of housing, which can be notably produced by injection molding, extrusion or other shaping technologies.

In particular, the polymer composition (C) is very well suited for the production of housing components of mobile electronic device.

Therefore, the at least one part of the mobile electronic device according to the present invention is advantageously a component of a mobile electronic device housing. By "mobile electronic device housing" is meant one or more of the back cover, front cover, antenna housing, frame and/or backbone of a mobile electronic device. The housing may be a single component-article or, more often, may comprise two or more components. By "backbone" is meant a structural component onto which other components of the device, such as electronics, microprocessors, screens, keyboards and keypads, antennas, battery sockets, and the like are mounted. The backbone may be an interior component that is not visible or only partially visible from the exterior of the mobile electronic device. The housing may provide protection for internal components of the device from impact and contamination and/or damage from environmental agents (such as liquids, dust, and the like). Housing components such as covers may also provide substantial or primary structural support for and protection against impact of certain components having exposure to the exterior of the device such as screens and/or antennas. Housing components may also be designed for their aesthetic appearance and touch.

In a preferred embodiment, the mobile electronic device housing is selected from the group consisting of a mobile phone housing, a tablet housing, a laptop computer housing and a tablet computer housing. Excellent results were obtained when the part of the mobile electronic device according to the present invention was a mobile phone housing.

The at least one part of the mobile electronic device according to the present invention is advantageously characterized by a thickness of a flat portion of said part being 0.9 mm or less, preferably 0.8 mm or less, more preferably 0.7 mm or less, still more preferably 0.6 mm or less and most preferably 0.5 mm or less on average. The term "on average" is herein intended to denote the average thickness of the part based on the measurement of its thickness on at least 3 points of at least one of its flat portions.

The Method for Manufacturing the Part

A further object of the present invention is a method for manufacturing a part of a mobile electronic device, as above detailed, said method comprising moulding composition (C) so as to provide said part.

The composition (C) is moulded to provide said part. Technique used for moulding is not particularly limited; standard techniques including shaping composition (C) in a molten/softened form can be advantageously applied, and include notably compression moulding, extrusion moulding, injection moulding, transfer moulding and the like.

It is nevertheless generally understood that especially when said part of the mobile electronic device possesses a complex design, injection moulding technique is the most versatile, and extensively used.

According to this technique, a ram or screw-type plunger is used for forcing a portion of composition (C) in its molten state into a mould cavity, wherein the same solidified into a shape that has confirmed to the contour of the mould. Then, the mould opens and suitable means (e.g. an array of pins, sleeves, strippers, etc.) are driven forward to demould the article. Then, the mould closes and the process is repeated.

In another embodiment of the present invention, the method for manufacturing a part of a mobile electronic device includes a step of machining of a standard shaped article so as to obtain said part having different size and shape from said standard shaped article. Non limiting examples of said standard shaped articles include notably a plate, a rod, a slab and the like. Said standard shaped parts can be obtained by any processing technique, including notably extrusion or injection moulding of the polymer composition (C).

The parts of the mobile electronic devices according to the present invention may be coated with metal by any known methods for accomplishing that, such as vacuum deposition (including various methods of heating the metal to be deposited), electroless plating, electroplating, chemical vapor deposition, metal sputtering, and electron beam deposition. Hence, the method, as above detailed, may additionally comprise at least one additional step comprising coating at least one metal onto at least a part of the surface of the said part.

Although the metal may adhere well to the parts without any special treatment, usually some well-known in the art method for improving adhesion will be used. This may range from simple abrasion of the surface to roughen it, addition of adhesion promotion agents, chemical etching, functionalization of the surface by exposure to plasma and/or radiation (for instance laser or UV radiation) or any combination of these.

Also, some of the metal coating methods comprise at least one step where the part is immersed in an acid bath. More than one metal or metal alloy may be plated onto the parts made of the polymer composition (C), for example one metal or alloy may be plated directly onto the surface because of its good adhesion, and another metal or alloy may be plated on top of that because it has a higher strength and/or stiffness. Useful metals and alloys to form the metal coating include copper, nickel, iron-nickel, cobalt, cobalt-nickel, and chromium, and combinations of these in different layers. Preferred metals and alloys are copper, nickel, and iron-nickel, and nickel is more preferred. The surface of the part may be fully or partly coated with metal. In different areas of the part the thickness and/or the number of metal layers, and/or the composition of the metal layers may vary. The metal may be coated in patterns to efficiently improve one or more properties in certain sections of the part.

The part, as obtained from the method above, is generally assembled with other components in order to manufacture a mobile electronic device.

The Method for the Manufacture of the Mobile Electronic Device

Still another object of the invention is the manufacture of a mobile electronic device, said method including the steps of:

a. providing as components at least a circuit board, a screen and a battery;

b. providing at least one part made of the polymer composition (C), as above detailed;

c. assembling at least one of said components with said part or mounting at least one of said components on said part.

Should the disclosure of any patents, patent applications, and publications which are incorporated herein by reference conflict with the description of the present application to the extent that it may render a term unclear, the present description shall take precedence.

The invention will now be described with reference to the following examples, whose purpose is merely illustrative and not intended to limit the scope of the invention.

Raw Materials

SOLEF® 6008/0001 PVDF is a low-viscosity PVDF homopolymer having a melt flow rate (at 230° C./2.16 kg, ASTM D1238) of about 5.5 to 11 g/10 min, a melt flow rate (230° C./5 kg) of 16 to 30 g/10 min, a heat of fusion ($\Delta H_f$) of about 63 J/g, commercially available from Solvay Specialty Polymers (6008, herein after).

OPTIX® CA51 PMMA is a polymethylmethacrylate homopolymer having a melt from rate (230° C./3.8 kg, ASTM D1238) of about 15.0 g/10 min, commercially available from Plaskolite, Inc (CA51, herein after).

SOLEF® XPH-909 PVDF is a composition comprising 70% wt of SOLEF® 6008 PVDF, 15% wt of PARALOID® EXL 2314 acrylic elastomer, and 15% wt of CA51 (XPH-909, herein after).

SACHTOLITH® HD-S white pigment is synthetic micronized ZnS (ZnS: >98% wt, primarily of polycrystalline wurtzite form of ZnS), organically coated; it is commercially available from Sachtleben Chemie GmbH (ZnS, herein after).

PREPARATIVE EXAMPLE

Preparative Example 1: Manufacture of Polymer F-TPE-1

PVDF-P(VDF-HFP)-PVDF (P(VDF-HFP) VDF: 78.5% by moles, HFP: 21.5% by moles)

In a 7.5 liters reactor equipped with a mechanical stirrer operating at 72 rpm, 4.5 l of demineralized water and 22 ml of a microemulsion, previously obtained by mixing 4.8 ml of a perfluoropolyoxyalkylene having acidic end groups of formula $CF_2ClO(CF_2-CF(CF_3)O)_n(CF_2O)_mCF_2COOH$, wherein n/m=10, having an average molecular weight of 600, 3.1 ml of a 30% v/v $NH_4OH$ aqueous solution, 11.0 ml of demineralized water and 3.0 ml of GALDEN® D02 perfluoropolyether of formula $CF_3O(CF_2CF(CF_3)O)_n(CF_2O)_mCF_3$, wherein n/m=20, having an average molecular weight of 450, were introduced.

The reactor was heated and maintained at a set-point temperature of 85° C.; a mixture of vinylidene fluoride (VDF) (78.5% by moles) and hexafluoropropylene (HFP) (21.5% by moles) was then added to reach a final pressure of 20 bar. Then, 8 g of 1,4-diiodoperfluorobutane ($C_4F_8I_2$) as chain transfer agent were introduced, and 1.25 g of ammonium persulfate (APS) as initiator were introduced. Pressure was maintained at a set-point of 20 bar by continuous feeding of a gaseous mixture of vinylidene fluoride (VDF) (78.5% by moles) and hexafluoropropylene (HFP) (21.5% by moles) up to a total of 2000 g. Moreover, 0.86 g of $CH_2=CH-(CF_2)_6-CH=CH_2$, fed in 20 equivalent portions each 5% increase in conversion, were introduced.

Once 2000 g of monomer mixture were fed to the reactor, the reaction was discontinued by cooling the reactor to room temperature. The residual pressure was then discharged and the temperature brought to 80° C. VDF was then fed into the autoclave up to a pressure of 20 bar, and 0.14 g of ammonium persulfate (APS) as initiator were introduced. Pressure was maintained at a set-point of 20 bar by continuous feeding of VDF up to a total of 500 g. Then, the reactor was cooled, vented and the latex recovered. The latex was treated with aluminum sulphate, separated from the aqueous phase, washed with demineralized water and dried in a convection oven at 90° C. for 16 hours.

Characterization data of the polymer so obtained are reported in Table 1.

TABLE 1

| DSC | | Prep. Ex. 1 |
|---|---|---|
| $T_g$ | [° C.] | −21.5 |
| $T_m$ | [° C.] | 162.5 |
| $\Delta H_f$ | [J/g] | 8.6 |

| Composition - NMR | | soft (A) | hard (B) |
|---|---|---|---|
| VDF | [% mol] | 78.5 | 100 |
| HFP | [% mol] | 21.5 | — |

General Procedure for Preparation of Compositions for the Manufacture of Injection Moulding Parts The ingredients, as detailed in Table 2, were compounded using a ZSK30 twin extruder, so as to obtain pellets, by extruding at a temperature of about 200° C., with a screw speed of 200 rpm at a throughput of 15 kg/h.

TABLE 2

| | Ex. 1C | Ex. 2 | Ex. 3C | Ex. 4C |
|---|---|---|---|---|
| F-TPE-1 | 100 | 25 | | |
| 6008 | | 75 | 100 | |
| XPH-909 | | | | 100 |
| ZnS | 2 | | | |

General Procedure for Injection Moulding of Parts

Pellets as obtained by extrusion were fed to a Toshiba ISG 150N injection molding device for the manufacture of injected parts having ASTM tensile bar shape, according to ASTM D790. The injection molding device used is equipped with a screw extruder barrel and a mould with clamping force up to 1000 kN, and melt pressure controller up to 2500 bar.

Injection molding conditions were such that melt temperature was about 190-210° C., and mold temperature was set to 35° C.

Properties of Injection Molded Specimens—Mechanical Properties

Injection molded specimens were tested for their tensile strength (according to ASTM D638). Results are summarized in table below.

TABLE 3

| Tensile properties | Ex. 1C | Ex. 2 | Ex. 3C | Ex. 4C |
|---|---|---|---|---|
| Elasticity Modulus (MPa) | 11.69 | 1300 | 2000 | 1800 |
| Tensile Strain at Break (%) | 420 | 98 | 50 | 91 |
| Tensile Strength at Break (MPa) | 7.49 | 28 | 35 | 27 |
| Tensile Strength at Yield (MPa) | 7.56 | 33.9 | 55 | 34 |

Properties of Injection Molded Specimens—Flexural Properties

Injection molded specimens were tested for their flexural properties (according to ASTM D790). Results are summarized in table below.

TABLE 4

| Flexural properties | Ex. 1C | Ex. 2 | Ex. 3C | Ex. 4C |
|---|---|---|---|---|
| Flexural Elasticity Modulus (MPa) | 20.6 | 1061 | 2200 | 1260 |
| Flexural Stress at 5% strain (MPa) | 1.52 | 41 | 78 | 39 |

Properties of Injection Molded Specimens—Colour/Stain Resistance

As-molded color of molded specimens was measured to assess the whiteness of the injection molded parts, when applying day-light type standard incident light (D65). The colour was measured according to the CIE L-a-b coordinates standard where the L* coordinate represents the lightness (black to white) scale, the a* coordinate represents the green-red chromaticity and the b* scale represents the blue-yellow chromaticity, and according to the CIE L-C-h coordinates standard, where the L* is as above in the CIE L-a-b standard, C* represents chroma, and h is the hue angle. The color coordinates were determined on the specimens as originally obtained, and on the same after exposure to certain staining agents (ketchup, mustard, sunscreen, sebum, wet denim), and cleaning up according to standardized procedure.

TABLE 5

| Run | L* | a* | b* | C* | h* |
|---|---|---|---|---|---|
| CIE L-a-b & CIE L-C-h values/original | | | | | |
| Ex. 1C | 96.32 | −0.23 | 3.1 | 3.11 | 94.21 |
| Ex. 2 | 73.47 | 1.29 | 10.15 | 10.24 | 82.77 |
| Ex. 3C | 62.61 | −0.04 | 1.41 | 1.41 | 91.71 |
| Ex. 4C | 91.45 | −0.35 | −0.73 | 0.81 | 244.55 |
| after ketchup staining and cleaning up | | | | | |
| Ex. 1C | 94.56 | −0.59 | 9.54 | 9.56 | 93.56 |
| Ex. 2 | 74.14 | 0.89 | 9.16 | 9.21 | 84.45 |
| Ex. 3C | 62.45 | −0.07 | 2.33 | 2.34 | 91.68 |
| Ex. 4C | 90.18 | −0.53 | 0.54 | 0.75 | 134.54 |
| after mustard staining and cleaning up | | | | | |
| Ex. 1C | 95.28 | −2.3 | 16.23 | 16.39 | 98.05 |
| Ex. 2 | 75.11 | −0.35 | 12.49 | 12.49 | 91.6 |
| Ex. 3C | 62.3 | −1.08 | 4.71 | 4.83 | 102.9 |
| Ex. 4C | 90.58 | −4.1 | 10.64 | 11.41 | 111.09 |
| after sunscreen staining and cleaning up | | | | | |
| Ex. 1C | 96.54 | −0.53 | 4.89 | 4.92 | 96.16 |
| Ex. 2 | 73.6 | 1.21 | 9.76 | 9.83 | 82.91 |
| Ex. 3C | 63 | −0.07 | 1.36 | 1.36 | 93.1 |
| Ex. 4C | 90.52 | −0.56 | −1.38 | 1.48 | 247.98 |
| after sebum staining and cleaning up | | | | | |
| Ex. 1C | 94.27 | −0.03 | 8.16 | 8.16 | 90.19 |
| Ex. 2 | 72.9 | 1.19 | 9.29 | 9.36 | 82.73 |
| Ex. 3C | 62.19 | −0.05 | 1.14 | 1.14 | 92.64 |
| Ex. 4C | 90.68 | −0.48 | −1.23 | 1.32 | 248.76 |

Same results regarding resistance to staining agents are expressed in table herein below as differences of values of singular coordinates after and before staining test (ΔL*, Δa*, Δb*, ΔC* and Δh*), and as ΔE and Δ94, whereas ΔE [ΔE=((ΔL*)²+(Δa*)²+(Δb*)²)$^{1/2}$] and Δ94 [Δ94=((ΔL*)²+(ΔC*)²+(Δh*)²)$^{1/2}$] are the distance in the respective color coordinates space.

TABLE 6

| Run | ΔL* | Δa* | Δb* | ΔC* | Δh* | ΔE | Δ94 |
|---|---|---|---|---|---|---|---|
| CIE L-a-b & CIE L-C-h values/ketchup | | | | | | | |
| Ex. 1C | 94.56 | −0.59 | 9.54 | 9.56 | 93.56 | 6.68 | 5.73 |
| Ex. 2 | 0.66 | −0.4 | −0.99 | −1.03 | 0.28 | 1.26 | 0.82 |
| Ex. 3C | −0.17 | −0.03 | 0.92 | 0.92 | 0 | 0.94 | 0.87 |
| Ex. 4C | −0.36 | −0.05 | 1.81 | −0.6 | −1.71 | 1.85 | 1.78 |
| CIE L-a-b & CIE L-C-h values/mustard | | | | | | | |
| Ex. 1C | 95.28 | −2.3 | 16.23 | 16.39 | 98.05 | 13.34 | 11.68 |
| Ex. 2 | 1.63 | −1.64 | 2.33 | 2.26 | 1.74 | 3.29 | 2.31 |
| Ex. 3C | −0.32 | −1.04 | 3.3 | 3.42 | 0.51 | 3.47 | 3.25 |
| Ex. 4C | 0.03 | −3.62 | 11.91 | 10.05 | −7.36 | 12.45 | 11.9 |
| CIE L-a-b & CIE L-C-h values/sunscreen | | | | | | | |
| Ex. 1C | 96.54 | −0.53 | 4.89 | 4.92 | 96.16 | 1.83 | 1.6 |
| Ex. 2 | 0.12 | −0.07 | −0.4 | −0.4 | 0.02 | 0.42 | 0.28 |
| Ex. 3C | 0.38 | −0.03 | −0.05 | −0.05 | 0.03 | 0.39 | 0.2 |
| Ex. 4C | −0.03 | −0.08 | −0.1 | 0.13 | −0.03 | 0.13 | 0.12 |
| CIE L-a-b & CIE L-C-h values/sebum | | | | | | | |
| Ex. 1C | 94.27 | −0.03 | 8.16 | 8.16 | 90.19 | 5.47 | 4.57 |
| Ex. 2 | −0.58 | −0.1 | −0.87 | −0.87 | −0.01 | 1.04 | 0.66 |
| Ex. 3C | 0.13 | 0 | 0.04 | −0.04 | −0.01 | 0.13 | 0.07 |
| Ex. 4C | −0.42 | −0.01 | −0.28 | −0.27 | 0.02 | 0.5 | 0.33 |

All data comprised above clearly demonstrate the surprising effect that stain resistance is improved when adding to the fluorinated thermoplastic elastomer the vinylidene fluoride, with lower distances in color space (both in terms of ΔE and Δ94) after exposure to the above-listed large variety of staining agents, representative of common agents which mobile electronics and accessories thereof maybe exposed to, during their daily use.

Flammability Performances According to UL Standard

Injection molded specimens were tested for their flame retardancy properties according to UL methodologies. Results are summarized in table below.

TABLE 7

| | Ex. 1C | Ex. 2 | Ex. 3C | Ex. 4C |
|---|---|---|---|---|
| Longest T1 | 0 | 0 | 0 | 204 |
| Longest T2 | 0 | 0 | 0 | 218 |
| Afterglow + T2 | 0 | 0 | 0 | 396 |
| T1 + T2 | 0 | 0 | 0 | 1087 |
| Burn to Clamp | 0 | 0 | 0 | 5 |
| Ignited cotton | 0 | 0 | 0 | 5 |
| UL Rating | V-0 | V-0 | V-0 | NR |
| Thickness | 3.15 | 3.00 | 3.20 | 3.20 |

The invention claimed is:
1. A fluoropolymer composition comprising:
   at least one polymer (F) possessing a heat of fusion (ΔH$_f$) of at least 25 J/g, when determined according to ASTM D3418, said polymer (F) being present in in an amount of from 50 to 95% wt, wherein said polymer (F) is a thermoplastic fluoropolymer comprising:
   (a') at least 85% by moles of recurring units derived from vinylidene fluoride (VDF);
   (b') optionally from 0.1 to 15% by moles of recurring units derived from a fluorinated monomer different from VDF; and
   (c') optionally from 0.1 to 5%, by moles of recurring units derived from one or more hydrogenated comonomer(s),
   all the aforementioned % by moles referring to the total moles of recurring units of the polymer (F);

at least one thermoplastic elastomer [polymer (F-TPE)] comprising:
  (i) at least one elastomeric block (A) consisting of a sequence of recurring units, said sequence comprising recurring units derived from at least one fluorinated monomer, said block (A) possessing a glass transition temperature of less than 25° C., as determined according to ASTM D3418,
  (ii) at least one thermoplastic block (B) consisting of a sequence of recurring units, said sequence comprising recurring units derived from at least one fluorinated monomer,
  wherein the crystallinity of said block (B) and its weight fraction in the polymer (F-TPE) are such to provide for a heat of fusion ($\Delta H_f$) of the polymer (F-TPE) of at most 20 J/g, when determined according to ASTM D3418,
  said polymer (F-TPE) being present in an amount of from 5 to 35% wt; and optionally
at least one methyl methacrylate polymer [polymer (M)] in an amount of at most 25% wt,
the % wt being referred to the sum of weights of polymer (F), polymer (F-TPE) and polymer (M).

2. The composition (C) according to claim 1, wherein the polymer (F-TPE) comprises:
  at least one elastomeric block (A) selected from the group consisting of:
  (1) vinylidene fluoride (VDF)-based elastomeric blocks ($A_{VDF}$) consisting of a sequence of recurring units, said sequence comprising recurring units derived from VDF and recurring units derived from at least one fluorinated monomer different from VDF, said fluorinated monomer different from VDF being selected from the group consisting of:
  (a) $C_2$-$C_8$ perfluoroolefins;
  (b) hydrogen-containing $C_2$-$C_8$ fluoroolefins different from VDF;
  (c) $C_2$-$C_8$ chloro- and/or bromo-containing fluoroolefins;
  (d) perfluoroalkylvinylethers (PAVE) of formula $CF_2=CFOR_{f1}$, wherein $R_{f1}$ is a $C_1$-$C_6$ perfluoroalkyl group;
  (e) perfluorooxyalkylvinylethers of formula $CF_2=CFOX_0$, wherein $X_0$ is a $C_1$-$C_{12}$ perfluorooxyalkyl group comprising one or more than one ethereal oxygen atom; and
  (f) (per)fluorodioxoles of formula:

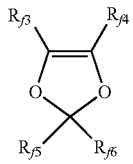

wherein each of $R_{f3}$, $R_{f4}$, $R_{f5}$ and $R_{f6}$, equal to or different from each other, is independently a fluorine atom, a $C_1$-$C_6$ perfluoro(oxy)alkyl group, optionally comprising one or more oxygen atoms; and
  (2) tetrafluoroethylene (TFE)-based elastomeric blocks ($A_{TFE}$) consisting of a sequence of recurring units, said sequence comprising recurring units derived from TFE and recurring units derived from at least one fluorinated monomer different from TFE, said fluorinated monomer being selected from the group consisting of those of classes (b), (c), (d), (e) as defined above; and
    at least one thermoplastic block (B) consisting of a sequence of recurring units, said sequence comprising recurring units derived from at least one fluorinated monomer.

3. The composition (C) according to claim 2, wherein the elastomeric block (A) is a block ($A_{VDF}$), consisting of a sequence of recurring units comprising:
  from 45% to 80% by moles of recurring units derived from vinylidene fluoride (VDF),
  from 5% to 50% by moles of recurring units derived from at least one fluorinated monomer different from VDF,
  optionally, up to 1.0% by moles of recurring units derived from at least one bis-olefin (OF) of formula:

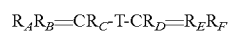

wherein $R_A$, $R_B$, $R_C$, $R_D$, $R_E$ and $R_F$, equal to or different from each other, are selected from the group consisting of H, F, Cl, $C_1$-$C_5$ alkyl groups and $C_1$-$C_5$ (per)fluoroalkyl groups, and T is a linear or branched $C_1$-$C_{18}$ alkylene or cycloalkylene group, optionally comprising one or more than one ethereal oxygen atom, or a (per)fluoropolyoxyalkylene group; and
  optionally, up to 30% by moles of recurring units derived from at least one hydrogenated monomer,
with respect to the total moles of recurring units of the sequence of block ($A_{VDF}$).

4. The composition (C) according to claim 1, wherein the block (B) is selected from the group consisting of:
  blocks ($B_{VDF}$) consisting of a sequence of recurring units derived from vinylidene fluoride and optionally from one or more than one additional fluorinated monomer different from VDF, and optionally from a hydrogenated monomer, wherein the amount of recurring units derived from VDF is of 85 to 100% moles, based on the total moles of recurring units of block ($B_{VDF}$);
  blocks ($B_{TFE}$) consisting of a sequence of recurring units derived from tetrafluoroethylene, and optionally from an additional perfluorinated monomer different from TFE, wherein the amount of recurring units derived from TFE is of 75 to 100% moles, based on the total moles of recurring units of block (B);
  blocks ($B_{E/(C)TFE}$) consisting of a sequence of recurring units derived from ethylene and recurring units derived from CTFE and/or TFE, optionally in combination with an additional monomer.

5. The composition (C) according to claim 1, wherein the weight ratio between blocks (A) and blocks (B) in polymer (F-TPE) is of 95:5 to 65:35.

6. The composition (C) according to claim 1, wherein the crystallinity of block (B) and its weight fraction in the polymer (F-TPE) are such to provide for a heat of fusion of the polymer (F-TPE) of at most 20 J/g, when determined according to ASTM D3418; and wherein polymer (F-TPE) combines thermoplastic and elastomeric character, so as to possess a certain crystallinity, delivering a heat of fusion of at least 2.5 J/g.

7. The composition (C) according to claim 1, wherein the polymer (F) is a polymer comprising:
  (a') at least 85% by moles of recurring units derived from vinylidene fluoride (VDF);
  (b') optionally from 0.1 to 12% by moles of recurring units derived from a fluorinated monomer different from VDF; and
  (c') optionally from 0.1 to 3% by moles of recurring units derived from one or more hydrogenated comonomer(s),
  all the aforementioned % by moles being referred to the total moles of recurring units of the polymer (F).

8. The composition (C) according to claim 1, wherein the polymer (F) is a polymer consisting essentially of:
  (a') at least 85% by moles of recurring units derived from vinylidene fluoride (VDF);

(b') optionally from 0.1 to 15% by moles of a fluorinated monomer different from VDF; said fluorinated monomer being selected from the group consisting of vinylfluoride (VF$_1$), chlorotrifluoroethylene (CTFE), hexafluoropropene (HFP), tetrafluoroethylene (TFE), perfluoromethylvinylether (MVE), trifluoroethylene (TrFE) and mixtures thereof, all the aforementioned % by moles being referred to the total moles of recurring units of the polymer (F).

9. The composition (C) according to claim 1, wherein polymer (M) is selected from homopolymers of methyl methacrylate and copolymers of methyl methacrylate and of C$_2$-C$_6$ alkyl acrylates, wherein the methyl methacrylate content of the copolymers is at least about 55% by weight and does not exceed about 90% by weight, with respect to the total weight of polymer (M).

10. The composition (C) according to claim 1, wherein the composition (C) does not comprise any polymer (M) and comprises:
from 65 to 95 wt of polymer (F-TPE) and
from 5 to 35% wt of polymer (F),
wherein % wt is defined with respect to the total weight of polymer (F-TPE) and polymer (F).

11. A mobile electronic device comprising at least one part comprising the fluoropolymer composition according to claim 1.

12. The mobile electronic device of claim 11, said device being selected from the group consisting of mobile phones, personal digital assistants, laptop computers, tablet computers, radios, cameras and camera accessories, watches, calculators, music players, global positioning system receivers, portable games, hard drives and other electronic storage devices.

13. The mobile electronic device according to claim 12, wherein the at least one part of the mobile electronic device is a mobile electronic device housing selected from the group consisting of a mobile phone housing, a tablet housing, a laptop computer housing and a tablet computer housing.

14. A method for manufacturing a part of a mobile electronic device, said method comprising moulding the composition (C) according to claim 1 so as to provide said part.

15. A method for the manufacture of a mobile electronic device, said method comprising:
a. providing as components at least a circuit board, a screen and a battery;
b. moulding at least one part from the polymer composition (C) according to claim 1; and
c. assembling at least one of said components with said part or mounting at least one of said components on said part.

16. The composition (C) according to claim 2, wherein at least one elastomeric block (A) is selected from the group consisting of:
(1) vinylidene fluoride (VDF)-based elastomeric blocks (A$_{VDF}$) consisting of a sequence of recurring units, said sequence comprising recurring units derived from VDF and recurring units derived from at least one fluorinated monomer different from VDF, said fluorinated monomer different from VDF being selected from the group consisting of: tetrafluoroethylene (TFE); hexafluoropropylene (HFP); vinyl fluoride; trifluoroethylene (TrFE); hexafluoroisobutylene (HFIB); perfluoroalkyl ethylenes of formula CH$_2$=CH—R$_{f1}$, wherein R$_{f1}$ is a C$_1$-C$_6$ perfluoroalkyl group; chlorotrifluoroethylene (CTFE); perfluoroalkylvinylethers (PAVE) of formula CF$_2$=CFOR$_{f1}$, wherein R$_{f1}$ is —CF$_3$, —C$_2$F$_5$ or —C$_3$F$_7$; perfluoromethoxyalkylvinylethers of formula CF$_2$=CFOCF$_2$OR$_{f2}$, wherein R$_{f2}$ is a C$_1$-C$_3$ perfluoro(oxy)alkyl group; and (per)fluorodioxoles of formula:

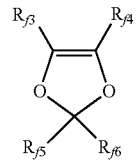

wherein each of R$_{f3}$, R$_{f4}$, R$_{f5}$ and R$_{f6}$, equal to or different from each other, is independently —F, —CF$_3$, —C$_2$F$_5$, —C$_3$F$_7$, —OCF$_3$ or —OCF$_2$CF$_2$OCF$_3$; and (2) tetrafluoroethylene (TFE)-based elastomeric blocks (A$_{TFE}$) consisting of a sequence of recurring units, said sequence comprising recurring units derived from TFE and recurring units derived from at least one fluorinated monomer different from TFE, said fluorinated monomer being selected from the group consisting of vinyl fluoride; trifluoroethylene (TrFE); hexafluoroisobutylene (HFIB); perfluoroalkyl ethylenes of formula CH$_2$=CH—R$_{f1}$, wherein R$_{f1}$ is a C$_1$-C$_6$ perfluoroalkyl group; chlorotrifluoroethylene (CTFE); perfluoroalkylvinylethers (PAVE) of formula CF$_2$=CFOR$_{f1}$, wherein R$_{f1}$ is —CF$_3$, —C$_2$F$_5$ or —C$_3$F$_7$; and perfluoromethoxyalkylvinylethers of formula CF$_2$=CFOCF$_2$OR$_{f2}$, wherein R$_{f2}$ is a C$_1$-C$_3$ perfluoro(oxy)alkyl group.

17. The composition (C) according to claim 6, wherein the crystallinity of block (B) and its weight fraction in the polymer (F-TPE) are such to provide for a heat of fusion of the polymer (F-TPE) of at most 18 J/g, when determined according to ASTM D3418; and wherein polymer (F-TPE) combines thermoplastic and elastomeric character, so as to possess a certain crystallinity, delivering a heat of fusion of at least 3.0 J/g.

18. The composition (C) according to claim 10, wherein the composition (C) does not comprise any polymer (M) and comprises:
from 70 to 90% wt of polymer (F-TPE) and
from 10 to 30% wt of polymer (F),
wherein % wt is defined with respect to the total weight of polymer (F-TPE) and polymer (F).

19. A fluoropolymer composition comprising:
at least one polymer (F) possessing a heat of fusion ($\Delta H_f$) of at least 25 J/g, when determined according to ASTM D3418, said polymer (F) being present in in an amount of from 50 to 95 wt, wherein polymer (F) is a thermoplastic fluoropolymer,
at least one thermoplastic elastomer [polymer (F-TPE)] comprising:
(i) at least one elastomeric block (A) consisting of a sequence of recurring units, said sequence comprising recurring units derived from at least one fluorinated monomer, said block (A) possessing a glass transition temperature of less than 25° C., as determined according to ASTM D3418,
(ii) at least one thermoplastic block (B) consisting of a sequence of recurring units, said sequence comprising recurring units derived from at least one fluorinated monomer, wherein the crystallinity of said block (B) and its weight fraction in the polymer (F-TPE) are such to provide for a heat of fusion ($\Delta H_f$) of the polymer (F-TPE) of at most 20 J/g, when determined according to ASTM D3418, said polymer (F-TPE) being present in an amount of from 5 to 35% wt; and at least one methyl methacrylate polymer [polymer (M)] in an amount of at most 25% wt, the % wt being referred to the sum of weights of polymer (F), polymer (F-TPE) and polymer (M).

20. The composition (C) according to claim 19, wherein the composition (C) comprises polymer (M), and wherein said composition (C) comprises:

from 55 to 90% wt of polymer (F-TPE);
from 7 to 30% wt of polymer (F); and
from 3 to 20% wt of polymer (M), with respect to the total weight of polymer (F), polymer (F-TPE) and polymer (M).

* * * * *